(12) United States Patent
Ohmae (10) Patent No.: US 10,843,381 B2
(45) Date of Patent: *Nov. 24, 2020

(54) LED WAFER PROCESSING METHOD

(71) Applicant: DISCO CORPORATION, Tokyo (JP)

(72) Inventor: Makiko Ohmae, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/456,395

(22) Filed: Jun. 28, 2019

(65) Prior Publication Data

US 2020/0020823 A1  Jan. 16, 2020

(30) Foreign Application Priority Data

Jul. 13, 2018  (JP) ................................. 2018-133553

(51) Int. Cl.
| | | |
|---|---|---|
| H01L 21/304 | (2006.01) | |
| B28D 5/02 | (2006.01) | |
| H01L 33/00 | (2010.01) | |
| B24B 9/06 | (2006.01) | |
| H01L 21/67 | (2006.01) | |
| H01L 21/78 | (2006.01) | |

(52) U.S. Cl.
CPC .............. B28D 5/029 (2013.01); B24B 9/065 (2013.01); H01L 21/3043 (2013.01); H01L 21/67092 (2013.01); H01L 21/78 (2013.01); H01L 33/0095 (2013.01); *H01L 33/007* (2013.01)

(58) Field of Classification Search
CPC ........... H01L 21/3043; H01L 21/67092; H01L 21/78; B28D 5/022–029
See application file for complete search history.

(56) References Cited

U.S. PATENT DOCUMENTS

| | | | | |
|---|---|---|---|---|
| 2003/0231683 A1* | 12/2003 | Chua | ...................... | B82Y 20/00 |
| | | | | 372/46.01 |
| 2006/0105547 A1* | 5/2006 | Audette | .................. | H01L 21/78 |
| | | | | 438/464 |
| 2014/0264768 A1* | 9/2014 | Buenning | ............... | H01L 21/78 |
| | | | | 257/620 |

(Continued)

FOREIGN PATENT DOCUMENTS

| | | | |
|---|---|---|---|
| JP | 10305420 A | 11/1998 | |
| JP | 2002192370 A | 7/2002 | |

*Primary Examiner* — Selim U Ahmed
*Assistant Examiner* — Evan G Clinton
(74) *Attorney, Agent, or Firm* — Greer Burns & Crain Ltd.

(57) ABSTRACT

An LED wafer processing method includes a dividing step of rotatably mounting a first cutting blade having a first width in a first cutting unit, holding an LED wafer on a holding table, and then relatively moving the first cutting unit and the holding table to cut the wafer along each division line formed on the wafer, thereby forming a full-cut groove along each division line to thereby divide the wafer into individual chips. The method further includes rotatably mounting a second cutting blade having a second width larger than the first width in a second cutting unit after performing the dividing step, and then relatively moving the second cutting unit and the holding table to thereby polish the opposed side surfaces of the full-cut groove formed along each division line, whereby a polished groove larger in width than the full-cut groove is formed along each full-cut groove.

11 Claims, 8 Drawing Sheets

(56) References Cited

U.S. PATENT DOCUMENTS

| | | | |
|---|---|---|---|
| 2015/0177558 A1* | 6/2015 | Sugihara | B32B 37/1284 174/261 |
| 2016/0133784 A1* | 5/2016 | Minamiru | H01L 33/0095 438/33 |
| 2019/0287856 A1* | 9/2019 | Shimada | H01L 21/02378 |
| 2020/0027739 A1* | 1/2020 | Ohmae | B23K 26/38 |

* cited by examiner

LED WAFER PROCESSING METHOD

BACKGROUND OF THE INVENTION

Field of the Invention

The present invention relates to a light emitting diode (LED) wafer processing method for dividing an LED wafer into a plurality of individual LED chips, in which the LED wafer is formed from a sapphire substrate, and a plurality of LEDs are formed on the front side of the sapphire substrate so as to be separated from each other by a plurality of division lines.

Description of the Related Art

A plurality of crossing division lines are formed on the front side of a sapphire substrate to thereby define a plurality of separate regions where a plurality of LEDs are respectively formed, thus forming an LED wafer having the plural LEDs on the front side. The LED wafer is divided along the division lines by using a laser processing apparatus to obtain a plurality of individual LED chips respectively including the plural LEDs. The LED chips thus obtained are used in electrical equipment such as mobile phones and illumination equipment.

In general, a sapphire substrate has high hardness and much time is therefore required for cutting of the sapphire substrate by using a cutting blade mounted in a cutting apparatus. Accordingly, it is difficult to efficiently divide the LED wafer into the individual LED chips by using a cutting apparatus. For this reason, a laser processing apparatus is used to divide the LED wafer into the individual LED chips.

It is known that such a laser processing apparatus for realizing the processing of a sapphire substrate may be classified into two types. One of the two types is such that a laser beam having an absorption wavelength to sapphire is applied to the sapphire substrate along each division line, thereby performing ablation along each division line to form a division groove (laser processed groove) along each division line (see JP Hei 10-305420A, for example). The other type is such that a laser beam having a transmission wavelength to sapphire is first applied to the sapphire substrate along each division line, thereby forming a modified layer as a division start point inside the sapphire substrate along each division line, and an external force is next applied to the sapphire substrate to thereby divide the sapphire substrate along each division line (see Japanese Patent No. 3408805, for example). By using any type of laser processing apparatus, the LED wafer can be divided into the individual LED chips.

SUMMARY OF THE INVENTION

According to the above laser processing apparatus, the LED wafer formed from a sapphire substrate can be divided into the individual LED chips more efficiently as compared with the case of using a cutting blade. However, the side surface of each LED chip is modified by the application of a laser beam, causing a reduction in luminance of each LED chip.

It is therefore an object of the present invention to provide an LED wafer processing method which can improve the luminance of each LED chip.

In accordance with an aspect of the present invention, there is provided an LED wafer processing method for dividing an LED wafer along a plurality of crossing division lines to obtain a plurality of individual LED chips, the LED wafer being formed from a sapphire substrate having a front side, the plurality of crossing division lines being formed on the front side of the sapphire substrate to thereby define a plurality of separate regions where a plurality of LEDs are respectively formed, the LED chips respectively including the LEDs, the LED wafer processing method including a cutting blade preparing step of preparing a first cutting blade having an annular first cutting edge having a first width and a second cutting blade having an annular second cutting edge having a second width larger than the first width, the first cutting edge containing diamond abrasive grains having a first grain size, the second cutting edge containing diamond abrasive grains having a second grain size smaller than the first grain size; a dividing step of rotatably mounting the first cutting blade in first cutting means, holding the LED wafer on a holding table in the condition where a front side of the LED wafer is exposed upward, and then relatively moving the first cutting means and the holding table to cut the front side of the LED wafer along each division line, thereby forming a full-cut groove along each division line, so that the full-cut groove has a depth reaching a back side of the LED wafer, whereby the LED wafer is divided into the individual LED chips; and a polishing step of rotatably mounting the second cutting blade in second cutting means after performing the dividing step, and then relatively moving the second cutting means and the holding table holding the LED wafer to thereby polish opposed side surfaces of the full-cut groove formed along each division line, whereby a polished groove larger in width than the full-cut groove is formed along each full-cut groove.

Preferably, a depth of cut by the first cutting blade in the dividing step is stepwise increased to cut the front side of the LED wafer along each division line in plural stages. Preferably, the average grain size of the diamond abrasive grains contained in the first cutting edge is set in a range of #300 to #500 as the first grain size, and the average grain size of the diamond abrasive grains contained in the second cutting edge is set in a range of #1800 to #2200 as the second grain size. Preferably, the width of the first cutting edge is set in a range of 0.15 to 0.24 mm as the first width, and the width of the second cutting edge is set in a range of 0.25 to 0.34 mm as the second width.

Preferably, the LED wafer processing method further includes a V-blade preparing step of preparing a V-blade having an annular cutting edge whose outer circumferential portion has a V-shaped cross section; and a chamfering step of rotatably mounting the V-blade in cutting means, holding the LED wafer on the holding table in the condition where the back side of the LED wafer is exposed upward, and then relatively moving the cutting means and the holding table to form a chamfered portion on the back side of the LED wafer in an area corresponding to each division line formed on the front side of the LED wafer. Preferably, the V-blade includes a plurality of V-blades having a plurality of annular cutting edges whose outer circumferential portions have different V-shaped cross sections such that the plurality of annular cutting edges of the plurality of V-blades have different tip angles, and the chamfering step is performed by stepwise mounting the plurality of V-blades in the cutting means. More preferably, the plurality of V-blades include three kinds of V-blades having three kinds of cutting edges, and the different tip angles of the three kinds of cutting edges include a first tip angle of 110 to 130 degrees, a second tip angle of 80 to 100 degrees, and a third tip angle of 50 to 70 degrees.

Preferably, the cutting edge of the V-blade contains diamond abrasive grains having an average grain size of #1800 to #2200. Preferably, a depth of cut by the plurality of V-blades is stepwise increased in the chamfering step every time the V-blades are stepwise mounted in the cutting means, thereby cutting the back side of the LED wafer along each division line in plural stages. More preferably, a depth of cut to be stepwise increased in the chamfering step is set in a range of 0.04 to 0.06 mm per stage.

According to the present invention, an LED wafer conventionally difficult to cut by using a cutting blade can be divided into individual LED chips. Further, no modified layer is formed on the side surface of each LED chip. Accordingly, as compared with a processing method for dividing an LED wafer by using a laser beam, the luminance of each LED chip can be improved. Further, by performing a chamfering step using a V-blade having an annular cutting edge whose outer circumferential portion has a V-shaped cross section to cut the back side of the LED wafer in an area corresponding to each division line, the luminance can be further improved.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
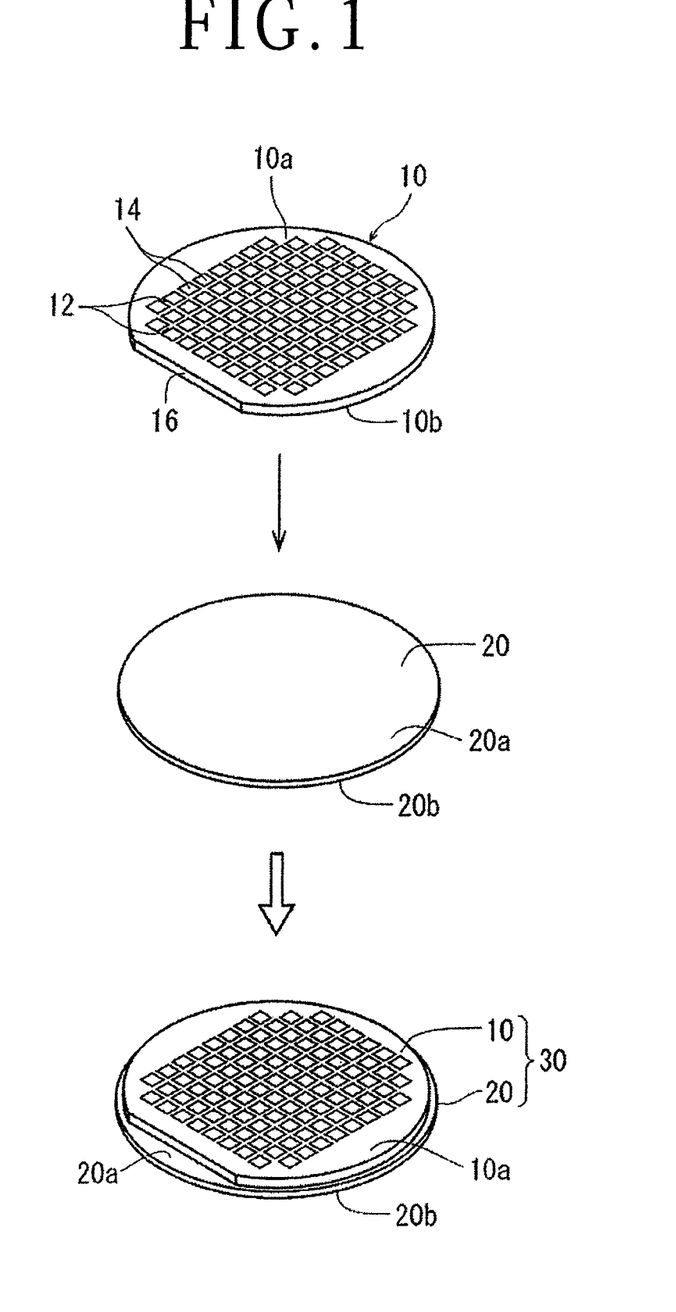
FIG. 1 is a perspective view depicting a manner of attaching an LED wafer to a support substrate to thereby form a wafer unit.

There will now be described an LED wafer processing method according to a first preferred embodiment of the present invention with reference to FIGS. 1 to 6B. In performing the LED wafer processing method according to the first preferred embodiment, an LED wafer 10 as a workpiece is prepared as depicted in FIG. 1. The LED wafer 10 is composed of a substantially circular sapphire substrate and a GaN layer formed on the front side (upper surface) of the sapphire substrate. The sapphire substrate has a thickness of 0.45 mm. The GaN layer is partitioned by a plurality of crossing division lines 12 to thereby define a plurality of separate regions where a plurality of LEDs 14 are respectively formed. The plural crossing division lines 12 are composed of a plurality of parallel division lines 12 extending in a first direction and a plurality of parallel division lines 12 extending in a second direction perpendicular to the first direction. The outer circumference of the LED wafer 10 is formed with a straight portion, i.e., so-called orientation flat 16 indicating crystal orientation. The LED wafer 10 has a front side 10*a* and a back side 10*b* opposite to the front side 10*a*, in which the LEDs 14 are formed on the front side 10*a* of the LED wafer 10.

After preparing the LED wafer 10, a disk-shaped support substrate 20 slightly larger in diameter than the LED wafer 10 is prepared as depicted in FIG. 1. The support substrate 20 is a substrate having a predetermined rigidity, and it is formed of polyethylene terephthalate (PET), for example. As depicted in FIG. 1, the support substrate 20 has a front side (upper surface) 20*a* and a back side (lower surface) 20*b* opposite to the front side 20*a*. The back side 10*b* of the LED wafer 10 is attached to the front side 20*a* of the support substrate 20 in the condition where the center of the LED wafer 10 coincides with the center of the support substrate 20, thereby forming a wafer unit 30 composed of the LED wafer 10 and the support substrate 20. In attaching the LED wafer 10 to the support substrate 20, a wax or the like is applied to the back side 10*b* of the LED wafer 10, so as to improve an adhesion strength.

Figure 2:
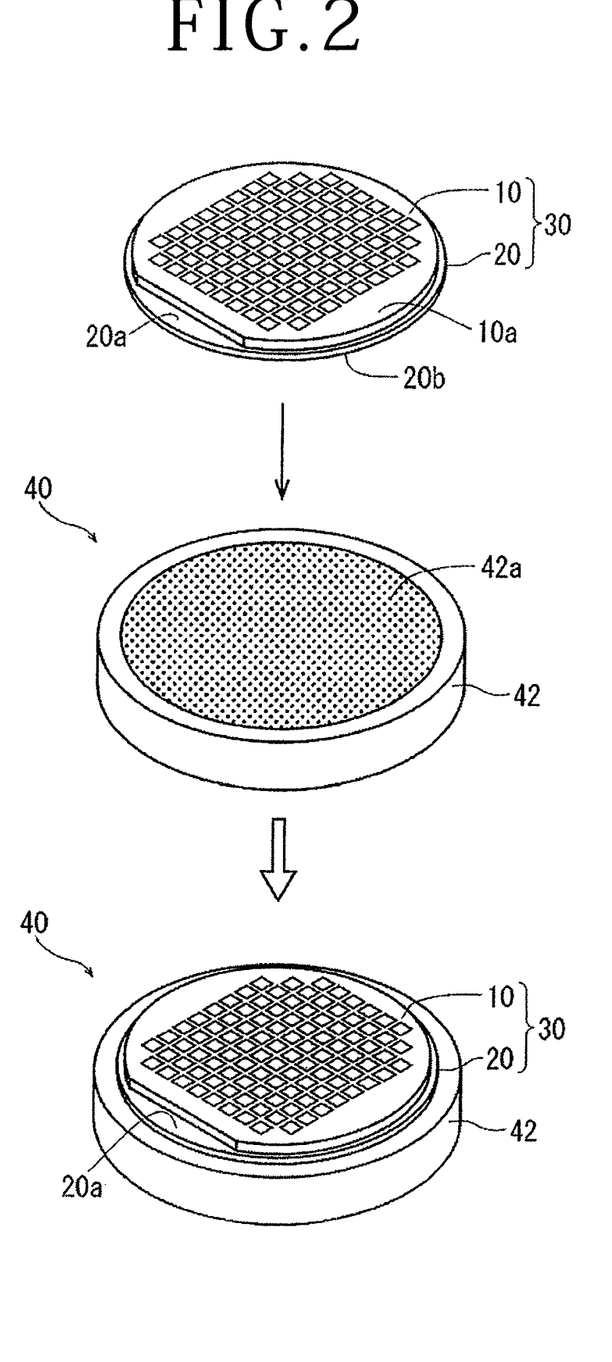
FIG. 2 is a perspective view depicting a manner of holding the wafer unit depicted in FIG. 1 on a holding table included in a cutting apparatus.

After forming the wafer unit 30 by attaching the LED wafer 10 to the support substrate 20, the wafer unit 30 is transferred to a cutting apparatus 40 depicted in FIG. 2 (a part of the cutting apparatus 40 being depicted). The cutting apparatus 40 includes a circular holding table 42 having a circular vacuum chuck 42*a* for holding the wafer unit 30 under suction. The wafer unit 30 transferred to the cutting apparatus 40 is first placed on the vacuum chuck 42*a* of the holding table 42 in the condition where the support substrate 20 is oriented downward, that is, the back side 20*b* of the support substrate 20 is in contact with the upper surface of the vacuum chuck 42*a*. The vacuum chuck 42*a* is slightly smaller in diameter than the support substrate 20. The vacuum chuck 42*a* is connected to suction means (not depicted) producing a vacuum. In the above condition where the wafer unit 30 is placed on the vacuum chuck 42*a*, the suction means is operated to hold the wafer unit 30 on the vacuum chuck 42a under suction.

(Cutting Blade Preparing Step)

After holding the wafer unit 30 on the holding table 42 of the cutting apparatus 40 under suction as mentioned above, a cutting blade preparing step is performed as a preliminary step for a dividing step and a polishing step to be hereinafter described. The cutting blade preparing step will now be described with reference to FIG. 3.

Figure 3:
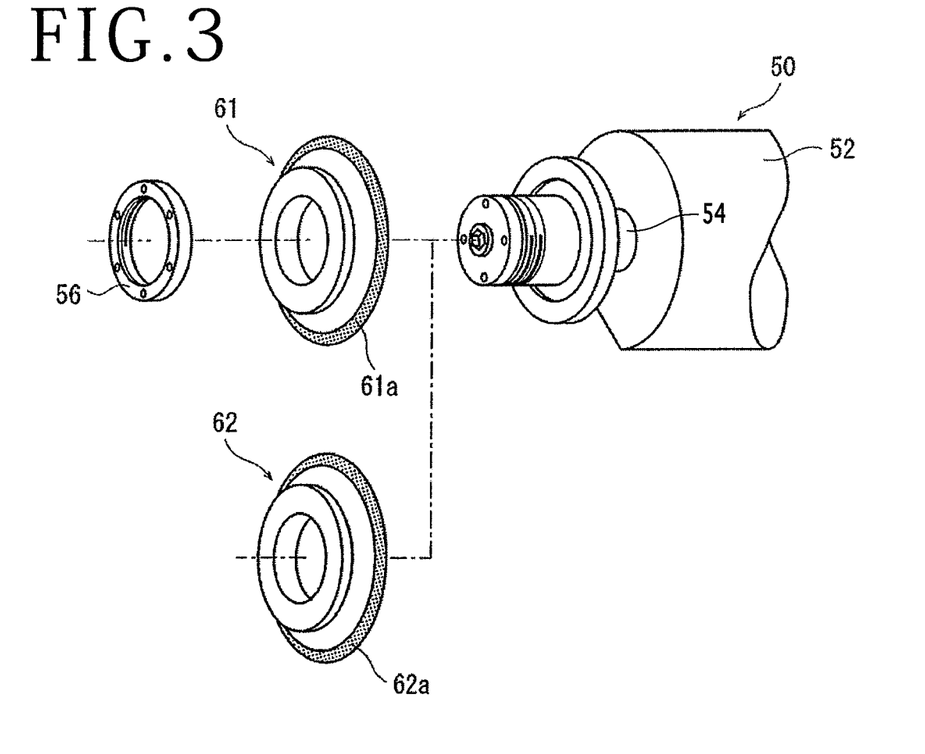
FIG. 3 is a perspective view depicting a cutting blade preparing step and a manner of selectively mounting a first cutting blade and a second cutting blade on a spindle included in the cutting apparatus.
Figure 4:
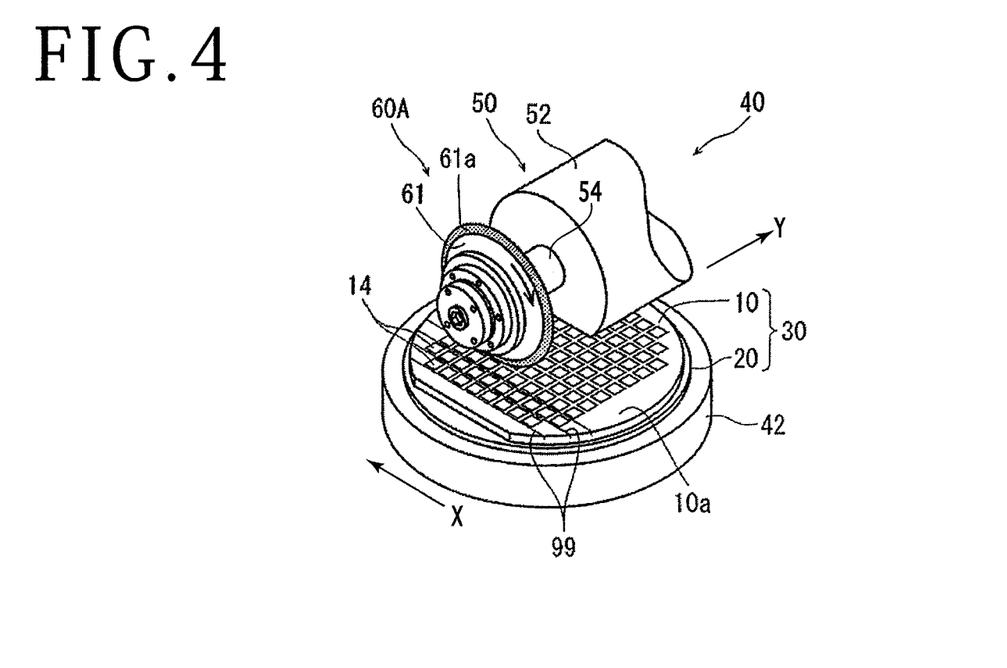
FIG. 4 is a perspective view depicting a dividing step using the first cutting blade depicted in FIG. 3.

The cutting apparatus 40 further includes a spindle unit 50 as cutting means. As depicted in FIG. 3, the spindle unit 50 includes a spindle housing 52 and a spindle 54 rotatably supported to the spindle housing 52. The spindle housing 52 is mounted on a movable base (not depicted) movable both in an indexing direction and a cutter feeding direction (vertical direction), in which the indexing direction is a direction perpendicular to a work feeding direction in a horizontal plane. Accordingly, the spindle housing 52 is movable both in the indexing direction and in the cutter feeding direction. The spindle 54 is adapted to be rotated about its horizontal axis extending in the indexing direction by a rotational drive mechanism (not depicted). In this cutting blade preparing step, a first cutting blade 61 and a second cutting blade 62 are adapted to be selectively mounted on the spindle 54 at its front end portion. The first cutting blade 61 or the second cutting blade 62 mounted on the spindle 54 is fixed by threadedly engaging a fastening nut 56 to the front end portion of the spindle 54. The first cutting blade 61 has an annular first cutting edge 61a formed along the entire outer circumference, and the second cutting blade 62 also has an annular second cutting edge 62a formed along the entire outer circumference. Both the first cutting edge 61a and the second cutting edge 62a are formed by fixing diamond abrasive grains with a metal bond or the like. The first cutting edge 61a has a width (thickness) smaller than that of the second cutting edge 62a. In other words, the second cutting edge 62a has a width (thickness) larger than that of the first cutting edge 61a.

In this preferred embodiment, the width of the first cutting edge 61a is set to 0.2 mm, and the outer diameter of the first cutting edge 61a is set to 50 mm. Further, the width of the second cutting edge 62a is set to 0.3 mm, and the outer diameter of the second cutting edge 62a is set to 50 mm. The diamond abrasive grains constituting the first cutting edge 61a has an average grain size of #400 (30 μm in diameter), and the diamond abrasive grains constituting the second cutting edge 62a has an average grain size of #2000 (4 μm in diameter). The width of the first cutting edge 61a is preferably selected in the range of 0.14 to 0.24 mm suitable for efficient division of the sapphire substrate, and the average grain size of the diamond abrasive grains of the first cutting edge 61a is preferably selected in the range of #300 to #500 which is a relatively large size. In contrast, the width of the second cutting edge 62a is preferably selected in the range of 0.25 to 0.34 mm slightly larger than the width of the first cutting edge 61a, and the average grain size of the diamond abrasive grains of the second cutting edge 62a is preferably selected in the range of #1800 to #2200 which is a relatively small size and suitable for polishing of the side surfaces of each LED chip 14' (see FIG. 5A) obtained by dividing the LED wafer 10, thereby improving the luminance of each LED chip 14'. In this manner, the cutting blade preparing step is completed.

(Dividing Step)

After completing the cutting blade preparing step, a dividing step is performed to divide the LED wafer 10. The dividing step will now be described with reference to FIGS. 4, 5A, and 5B. In performing the dividing step, the first cutting blade 61 is first mounted rotatably on the front end portion of the spindle 54 of the cutting apparatus 40, thereby configuring first cutting means 60A depicted in FIG. 4. After configuring the first cutting means 60A, alignment means including an imaging camera (not depicted) or the like in the cutting apparatus 40 is used to perform alignment between the first cutting blade 61 and the division lines 12 of the LED wafer 10 held on the holding table 42 under suction.

After performing the alignment, the first cutting blade 61 is positioned above one end of a predetermined one of the division lines 12 extending in the first direction as a cutting start position. In this condition, the rotational drive mechanism for rotating the spindle 54 is operated to rotate the spindle 54 and accordingly rotate the first cutting blade 61 fixedly mounted on the spindle 54. The first cutting blade 61 is rotated at a speed of 15,000 rpm, for example, by the rotational drive mechanism. Thereafter, the first cutting blade 61 is lowered to cut the front side 10a of the LED wafer 10 until a predetermined depth from the front side 10a, e.g., a depth of 0.15 mm. At the same time, the holding table 42 is moved in the feeding direction depicted by an arrow X in FIG. 4 at a feed speed of 2 mm/s, for example. Accordingly, the front side 10a of the LED wafer 10 is cut along the predetermined division line 12 by the first cutting blade 61 to form a half-cut groove 99 having a depth of 0.15 mm. Thereafter, the first cutting blade 61 is moved in the indexing direction depicted by an arrow Y in FIG. 4 to the position above the next division line 12 adjacent to the above predetermined division line 12 where the half-cut groove 99 has been formed. Thereafter, the cutting operation by the first cutting blade 61 is similarly performed along the next division line 12 to thereby form a similar half-cut groove 99. In this manner, the cutting operation is similarly performed along all of the other division lines 12 extending in the first direction to thereby form a plurality of similar half-cut grooves 99. Thereafter, the holding table 42 is rotated 90 degrees to similarly perform the cutting operation along all of the other division lines 12 extending in the second direction perpendicular to the first direction, thereby forming a plurality of similar half-cut grooves 99. Thus, the plural half-cut grooves 99 are respectively formed on the front side 10a of the LED wafer 10 along all of the plural crossing division lines 12, in which each half-cut groove 99 has a depth of 0.15 mm and a width of 0.2 mm.

As described above, the LED wafer 10 has a thickness of 0.45 mm, and each half-cut groove 99 formed in the dividing step has a depth of 0.15 mm. Accordingly, the LED wafer 10 is cut by the depth equal to ⅓ of the thickness of the LED wafer 10 in the above first stage of the dividing step. Thereafter, the spindle housing 52 is further lowered by 0.15 mm to thereby increase the depth of cut by 0.15 mm. In this condition, the first cutting blade 61 is similarly operated to further cut the front side 10a of the LED wafer 10 along all of the crossing division lines 12, that is, all of the half-cut grooves 99 previously formed. Accordingly, the depth of each half-cut groove 99 is increased to 0.3 mm by this second stage of the dividing step. That is, the LED wafer 10 is further cut by the depth equal to ⅓ of the thickness of the LED wafer 10 to increase the depth of each half-cut groove 99 to an amount equal to ⅓ of the thickness of the LED wafer 10 in the above second stage of the dividing step. Thereafter, the spindle housing 52 is further lowered by 0.15 mm to thereby increase the depth of cut by 0.15 mm. In this condition, the first cutting blade 61 is similarly operated to further cut the front side 10a of the LED wafer 10 along all of the crossing division lines 12, that is, along all of the half-cut grooves 99 previously increased in depth.

Figures 5A, 5B:
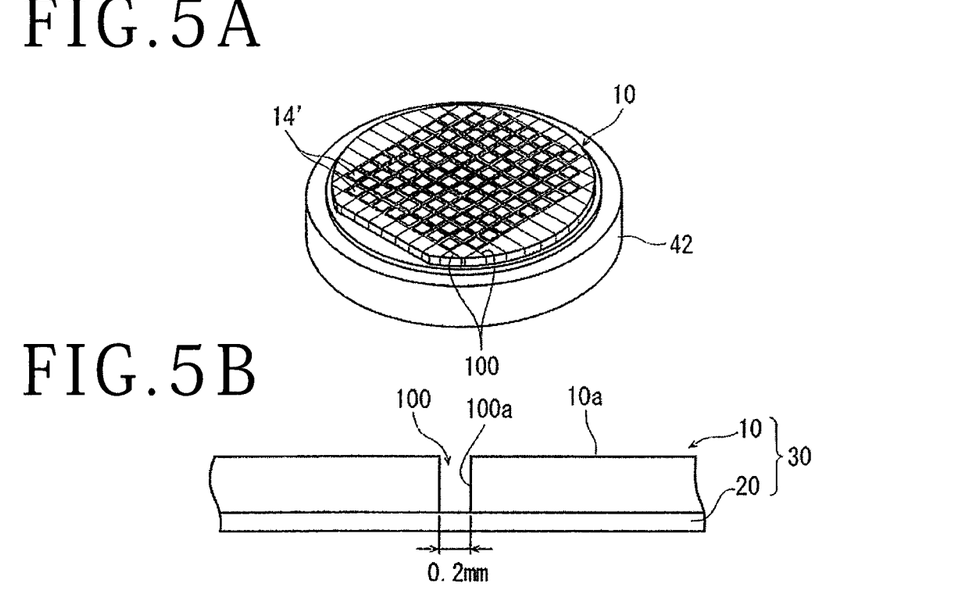
FIG. 5A is a perspective view depicting the LED wafer divided by the first cutting blade in the dividing step depicted in FIG. 4.
FIG. 5B is an enlarged side view of an essential part of the LED wafer depicted in FIG. 5A.

As a result, as depicted in FIG. 5B, which is an enlarged side view of an essential part of the wafer unit 30 depicted in FIG. 5A, a full-cut groove 100 having a depth of 0.45 mm and a width of 0.2 mm is formed along each division line 12, in which this depth is a depth extending from the front side 10a of the LED wafer 10 to the back side 10b thereof, that is, reaching the front side 20a of the support substrate 20. Accordingly, the LED wafer 10 is fully cut by the plural full-cut grooves 100 formed along all of the crossing division lines 12, thereby obtaining a plurality of individual LED chips 14' as depicted in FIG. 5A. In summary, the dividing step according to this preferred embodiment is composed of three stages to be sequentially performed in such a manner that the depth of cut by the first cutting blade 61 is stepwise increased by 0.15 mm per stage to cut the LED wafer 10 along each division line 12, so that the full-cut groove 100 having a depth of 0.45 mm reaching the support substrate 20 is formed along each division line 12 to thereby divide the LED wafer 10 into the individual LED chips 14' respectively including the LEDs 14. The depth of cut to be stepwise increased is not limited to 0.15 mm per stage, but it may be suitably adjusted. For example, the depth of cut to be stepwise increased may be set to 0.225 mm per stage. In this case, the LED wafer 10 having a thickness of 0.45 mm is cut stepwise in two stages to obtain the individual LED chips 14'. Further, the depth of cut to be stepwise increased may be suitably adjusted according to the thickness of the LED wafer 10. In this manner, the dividing step is completed.

As described above, the first cutting blade 61 used in performing the dividing step has the annular first cutting edge 61a, which contains diamond abrasive grains having a relatively large grain size and has a relatively small width. Accordingly, the time required for cutting of the LED wafer 10 can be reduced, so that the LED wafer 10 can be divided efficiently. However, the LED wafer 10 is cut along each division line 12 by using the first cutting edge 61a containing diamond abrasive grains having a relatively large grain size, that is, containing coarse abrasive grains, so that each full-cut groove 100 has a pair of opposed side surfaces 100a each having a large surface roughness, causing a reduction in luminance of each LED chip 14'. To cope with this problem, a polishing step is performed to polish each side surface 100a after performing the dividing step. This polishing step will now be described with reference to FIGS. 6A and 6B.

(Polishing Step)

Figure 6A:
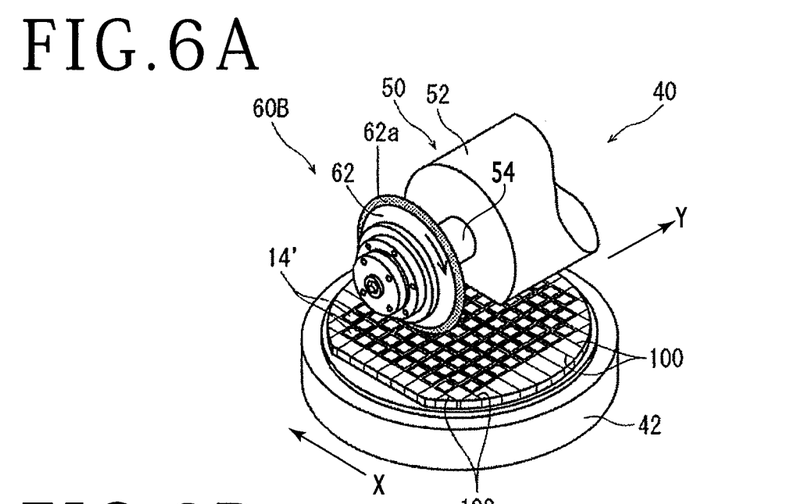
FIG. 6A is a perspective view depicting a polishing step using the second cutting blade depicted in FIG. 3.

After performing the dividing step by using the first cutting blade 61 set in the cutting apparatus 40, the first cutting blade 61 is removed from the front end portion of the spindle 54 constituting the first cutting means 60A, and the second cutting blade 62 previously prepared in the cutting blade preparing step is next mounted on the front end portion of the spindle 54, thereby configuring second cutting means 60B depicted in FIG. 6A.

Figure 6B:
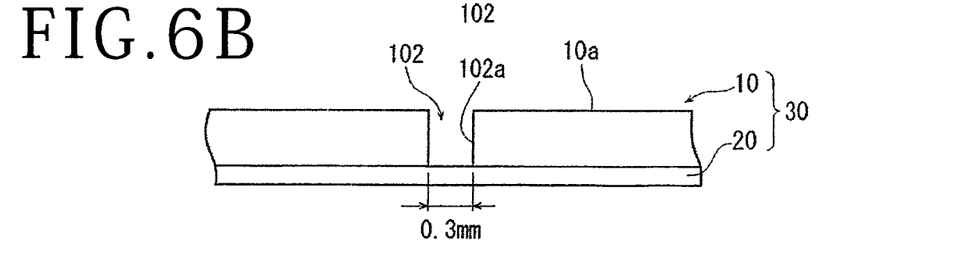
FIG. 6B is an enlarged side view of an essential part of the LED wafer polished by the second cutting blade in the polishing step depicted in FIG. 6A.

After configuring the second cutting means 60B, the depth of cut by the second cutting blade 62 is set to 0.45 mm reaching the bottom of each full-cut groove 100. In this condition, the second cutting blade 62 is rotated at a speed of 15,000 rpm as in the dividing step, and the holding table 42 holding the wafer unit 30 is moved in the feeding direction depicted by an arrow X in FIG. 6A to thereby make the second cutting blade 62 cut the LED wafer 10 along each division line 12, that is, along each full-cut groove 100 having a depth of 0.45 mm. Accordingly, the opposed side surfaces 100a of each full-cut groove 100 are polished by the second cutting blade 62 to thereby form a polished groove 102 depicted in FIG. 6B. As described above, the second cutting edge 62a of the second cutting blade 62 has a width of 0.3 mm larger than the width of the first cutting edge 61a. Further, the average grain size of the diamond abrasive grains constituting the second cutting edge 62a is set to #2000 (4 μm in diameter) smaller than that of the diamond abrasive grains constituting the first cutting edge 61a. Accordingly, as depicted in FIG. 6B which is an enlarged side view of an essential part of the LED wafer 10 depicted in FIG. 6A, the opposed side surfaces 100a of each full-cut groove 100 having a width of 0.2 mm depicted in FIG. 5B are polished by the second cutting edge 62a to form each polished groove 102 having a width of 0.3 mm, in which each polished groove 102 has a pair of opposed side surfaces 102a each having a relatively small surface roughness. That is, each side surface 100a of each full-cut groove 100 is polished by an amount of 0.05 mm. Each side surface 102a can provide a smooth side surface of each LED chip 14', thereby allowing a good luminance. In this manner, the polishing step is completed.

By performing the cutting blade preparing step, the dividing step, and the polishing step as mentioned above, the LED wafer 10 conventionally difficult to cut by using a cutting blade can be efficiently divided into the individual LED chips 14' by using the first cutting blade 61 and the second cutting blade 62. Further, no modified layer is formed on the side surface of each LED chip 14'. Accordingly, as compared with a processing method for dividing an LED wafer by using a laser beam, the luminance of each LED chip 14' can be improved.

A second preferred embodiment of the LED wafer processing method according to the present invention will now be described. The second preferred embodiment further includes a V-blade preparing step of preparing a V-blade having an annular cutting edge whose outer circumferential portion has a V-shaped cross section and a chamfering step of cutting the back side 10b of the LED wafer 10 in an area corresponding to each division line 12 by using the V-blade prepared above to thereby form a chamfered portion, in which the V-blade preparing step and the chamfering step are performed after performing the polishing step mentioned above. The V-blade preparing step and the chamfering step will now be described with reference to FIGS. 7 to 11C.

(V-Blade Preparing Step)

Figure 7:
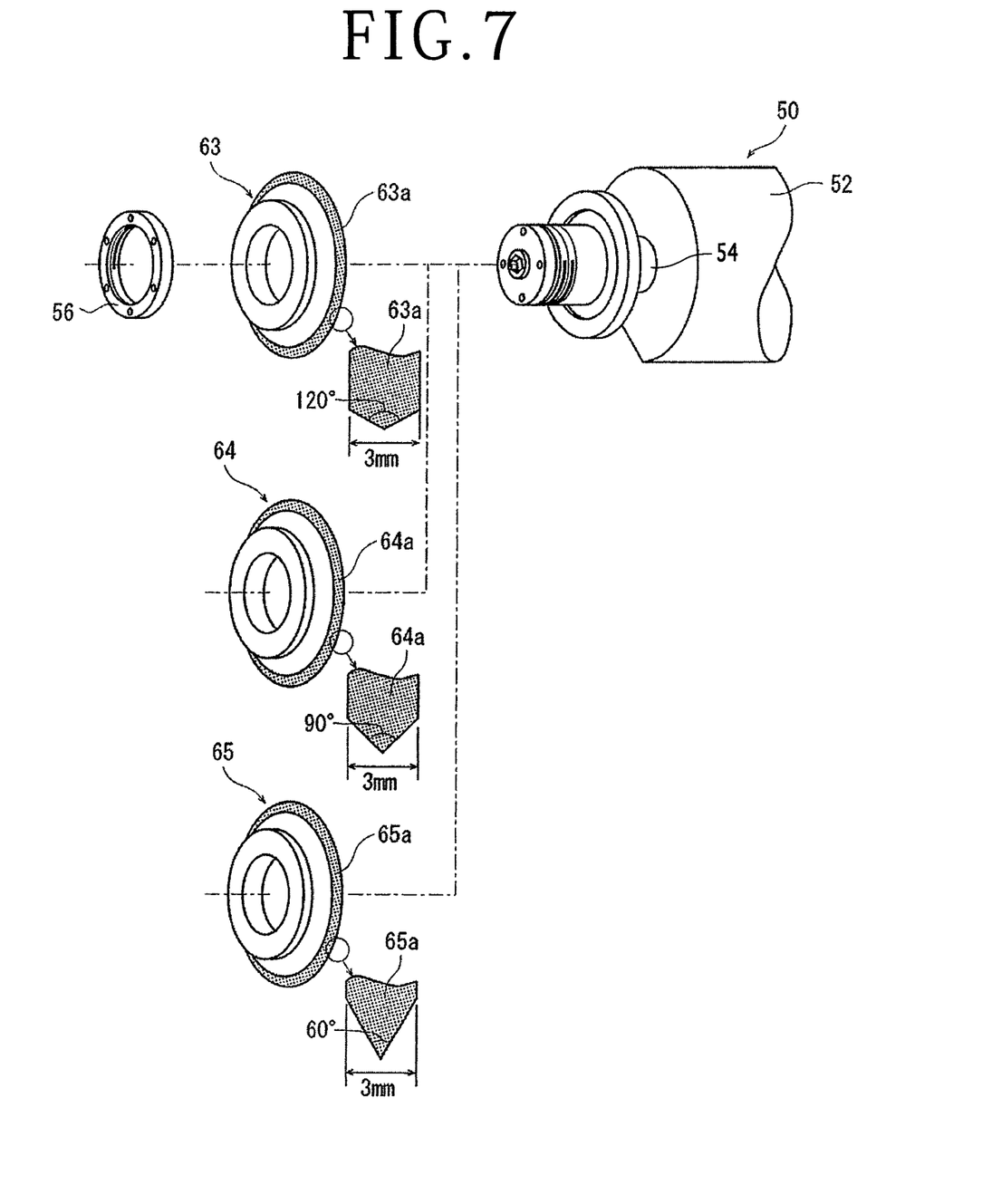
FIG. 7 is a perspective view depicting a V-blade preparing step and a manner of selectively mounting a first V-blade, a second V-blade, and a third V-blade on the spindle.

As depicted in FIG. 7, the V-blade preparing step is a step of preparing a V-blade having an annular cutting edge whose outer circumferential portion has a V-shaped cross section, in which the cutting edge is formed by fixing diamond abrasive grains with a metal bond or the like. More specifically, the V-blade is adapted to be mounted on the front end portion of the spindle 54 of the spindle unit 50 of the cutting apparatus 40. The annular cutting edge of this V-blade has an outer diameter of 60 mm and a width (thickness) of 3 mm, for example, larger than the width of each polished groove 102. Further, the diamond abrasive grains contained in the cutting edge of this V-blade preferably has an average grain size of #1800 to #2200, more preferably, #2000. In this preferred embodiment, this V-blade is composed of a first V-blade 63 having a first cutting edge 63a, a second V-blade 64 having a second cutting edge 64a, and a third V-blade 65 having a third cutting edge 65a. The outer circumferential portion of the first cutting edge 63a has a tip angle of 120 degrees as viewed in cross section. The outer circumferential portion of the second cutting edge 64a has a tip angle of 90 degrees as viewed in cross section. The outer circumferential portion of the third cutting edge 65a has a tip angle of 60 degrees as viewed in cross section. The first V-blade 63, the second V-blade 64, and the third V-blade 65 are adapted to be selectively mounted on the front end portion of the spindle 54. As depicted in FIG. 7, the first, second, or third V-blade 63, 64, or 65 mounted on the spindle 54 is fixed by threadedly engaging the fastening nut 56 with the front end portion of the spindle 54.

After performing this V-blade preparing step, the chamfering step is performed to form a chamfered portion on the back side 10b of the LED wafer 10 in an area corresponding to each division line 12. Prior to performing the chamfering step, a support substrate changing step is performed in the following manner.

Figure 8:
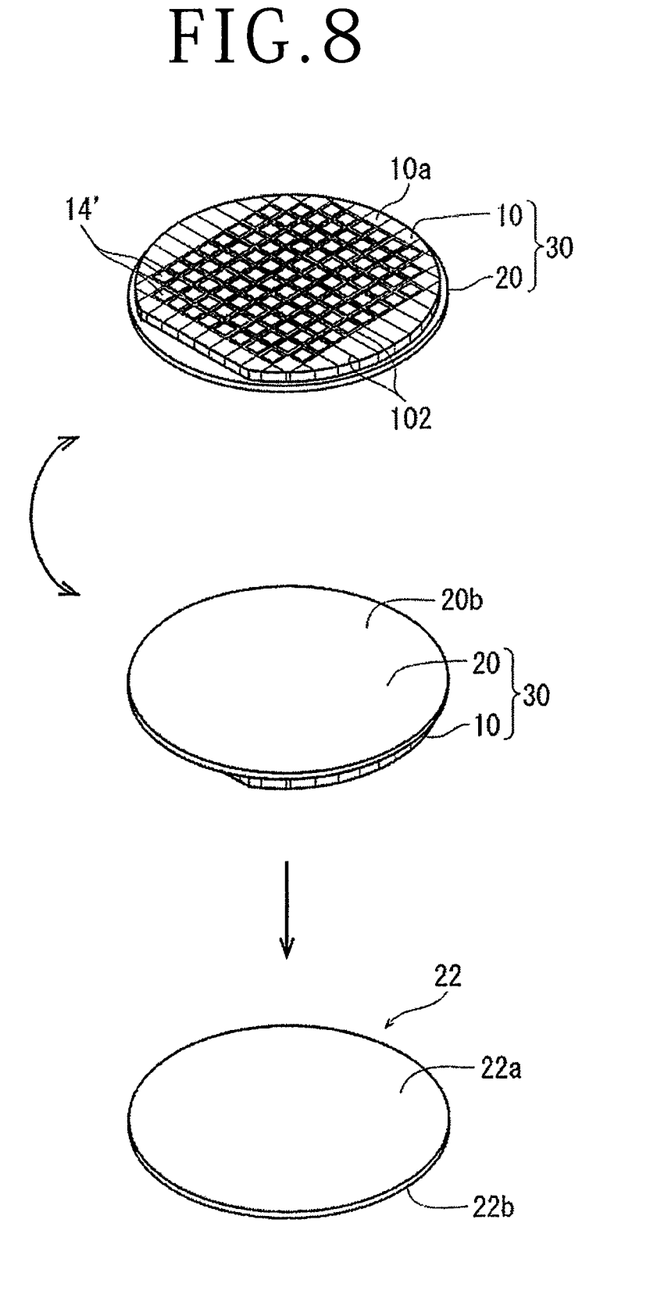
FIG. 8 is a perspective view depicting a manner of attaching the LED wafer of the wafer unit to a second support substrate in a support substrate changing step.
Figure 9:
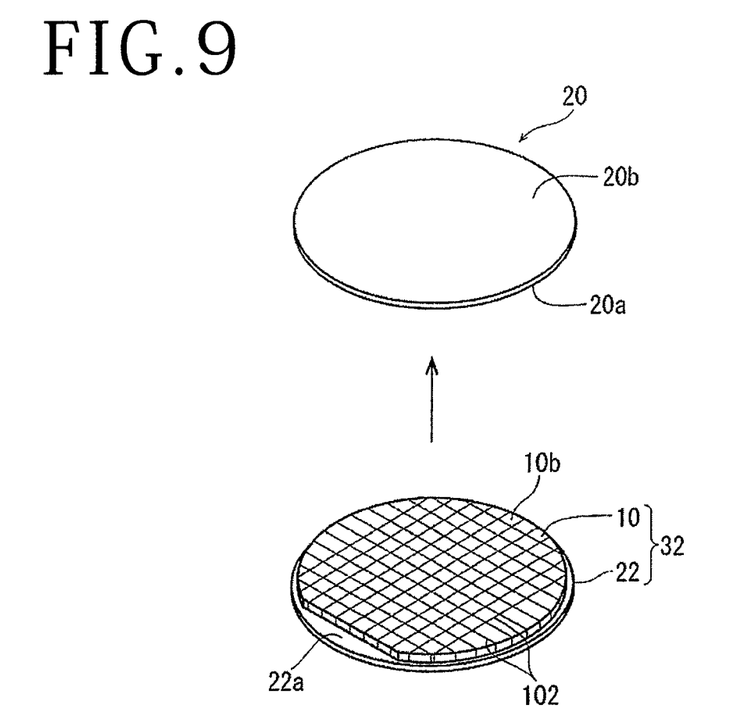
FIG. 9 is a perspective view depicting a manner of separating the original support substrate from the LED wafer attached to the second support substrate in the support substrate changing step.

As depicted in FIG. 8, the LED wafer 10 processed by the polishing step remains attached to the support substrate 20 in the condition where the front side 10a of the LED wafer 10 is oriented upward, that is, exposed, thus forming the wafer unit 30. The chamfering step is performed to the back side 10b of the LED wafer 10 as mentioned above. Therefore, the wafer unit 30 is once removed from the holding table 42 of the cutting apparatus 40 after performing the polishing step. Thereafter, as depicted in FIG. 8, the wafer unit 30 is inverted in such a manner that the front side 10a of the LED wafer 10 is oriented downward, that is, the back side 20b of the support substrate 20 is oriented upward. In this condition, the LED wafer 10 of the wafer unit 30 is attached through any adhesive or the like to another support substrate 22 having a front side (upper surface) 22a and a back side (lower surface) 22b. The adhesive is previously applied to the front side 10a of the LED wafer 10. More specifically, the front side 10a of the LED wafer 10 of the wafer unit 30 is attached to the front side 22a of the support substrate 22. The support substrate 22 has the same shape and size as those of the support substrate 20, and it is formed of the same material as that of the support substrate 20. After attaching the LED wafer 10 of the wafer unit 30 to the support substrate 22, the support substrate 20 is separated from the LED wafer 10 as depicted in FIG. 9, thereby forming a new wafer unit 32 composed of the LED wafer 10 and the support substrate 22. As apparent from FIG. 9, in the condition where the support substrate 20 has been separated from the LED wafer 10, the back side 10b of the LED wafer 10 of the wafer unit 32 is exposed upward, so that all the polished grooves 102 formed so as to respectively correspond to all the crossing division lines 12 are exposed upward. In this manner, the support substrate changing step is completed.

(Chamfering Step)

Figure 10:
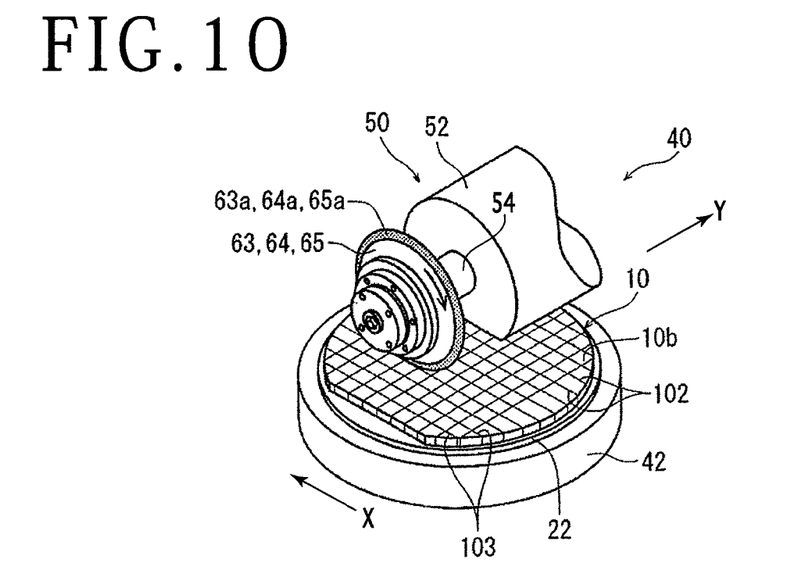
FIG. 10 is a perspective view depicting a chamfering step using the first V-blade, the second V-blade, and the third V-blade depicted in FIG. 7.
Figure 11A:
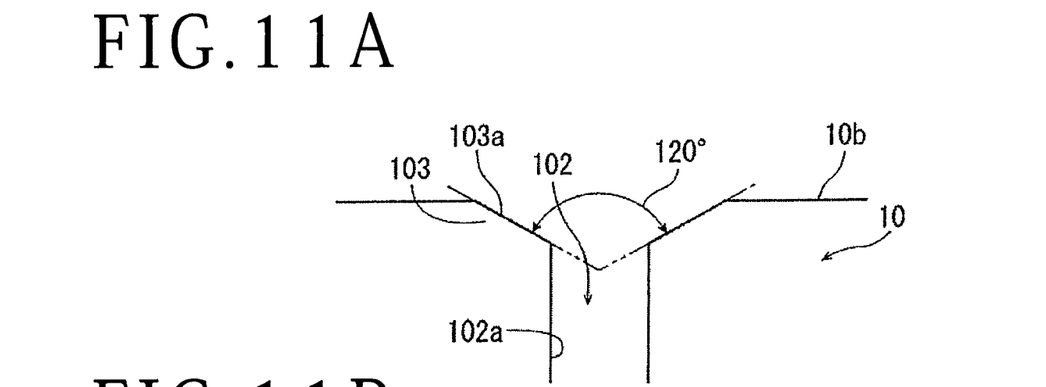
FIG. 11A is an enlarged side view of an essential part of the LED wafer chamfered by the first V-blade in the chamfering step.

After performing the V-blade preparing step and the support substrate changing step, the wafer unit 32 is transferred to the cutting apparatus 40 for performing the chamfering step, and the support substrate 22 of the wafer unit 32 is held on the holding table 42 under suction as depicted in FIG. 10. The first V-blade 63 having the first cutting edge 63a having a tip angle of 120 degrees is first mounted on the front end portion of the spindle 54 of the cutting apparatus 40, thereby configuring cutting means chamfering the edge portions of each polished groove 102. After holding the wafer unit 32 on the holding table 42 in the condition where the back side 10b of the LED wafer 10 is oriented upward, the alignment means including an imaging camera (not depicted) in the cutting apparatus 40 is operated to perform alignment between the first V-blade 63 and the polished grooves 102 exposed to the back side 10b of the LED wafer 10 held on the holding table 42. After performing this alignment, the rotational drive mechanism for rotating the spindle 54 is operated to rotate the spindle 54 at a speed of 30,000 rpm, for example. Further, the first V-blade 63 is positioned above one end of a predetermined one of the polished grooves 102 respectively corresponding to the division lines 12 extending in the first direction as a chamfering start position, in which the polished grooves 102 are exposed to the back side 10b of the LED wafer 10. Thereafter, the first V-blade 63 is lowered to cut the back side 10b of the LED wafer 10 until a predetermined depth from the back side 10b, e.g., a depth of 0.05 mm. At the same time, the holding table 42 is moved in the feeding direction depicted by an arrow X in FIG. 10 at a feed speed of 5 mm/s, for example. Accordingly, the back side 10b of the LED wafer 10 is cut along the predetermined polished groove 102 by the first V-blade 63 to form a chamfered portion 103. More specifically, as depicted in FIG. 11A, a first chamfered portion 103a constituting the chamfered portion 103 is formed at the edge portions of the predetermined polished groove 102 exposed to the back side 10b of the LED wafer 10 so as to form a tapering angle of 120 degrees. Thereafter, as similarly to the dividing step and the polishing step mentioned above, a plurality of first chamfered portions 103a are formed by the first V-blade 63 along all of the other polished grooves 102 exposed to the back side 10b of the LED wafer 10.

Figure 11B:
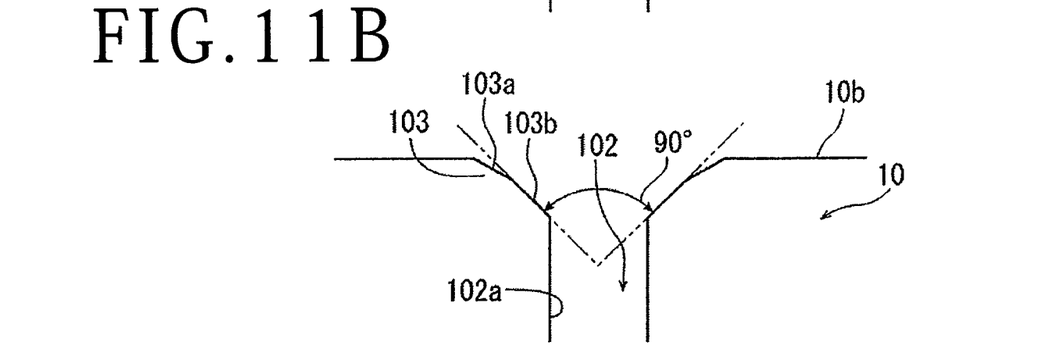
FIG. 11B is a view similar to FIG. 11A, depicting a condition where the LED wafer has been further chamfered by the second V-blade.

After forming the first chamfered portions 103a along all of the polished grooves 102 exposed to the back side 10b of the LED wafer 10 as depicted in FIG. 11A, the rotation of the spindle 54 is once stopped and the spindle unit 50 is next raised. Thereafter, the first V-blade 63 is removed from the spindle 54, and the second V-blade 64 having the second cutting edge 64a having a tip angle of 90 degrees is next mounted on the spindle 54. After mounting the second V-blade 64 on the spindle 54, the depth of cut by the second V-blade 64 is increased by 0.05 mm from the depth of cut (=0.05 mm) by the first V-blade 63, that is, the depth of cut by the second V-blade 64 is set to 0.1 mm from the back side 10b of the LED wafer 10. In this condition, the back side 10b of the LED wafer 10 is similarly cut along each polished groove 102 by the second V-blade 64. That is, the upper end of each polished groove 102 previously chamfered by the first V-blade 63 is further chamfered by the second V-blade 64. As a result, a second chamfered portion 103b is formed along each polished groove 102 having the first chamfered portion 103a as depicted in FIG. 11B. As apparent from FIG. 11B, the second chamfered portion 103b is formed below the first chamfered portion 103a (i.e., toward the front side 10a of the LED wafer 10) along each polished groove 102 because the second cutting edge 64a having a tip angle of 90 degrees is used and the depth of cut by the second V-blade 64 is increased by 0.05 mm as mentioned above.

Figure 11C:
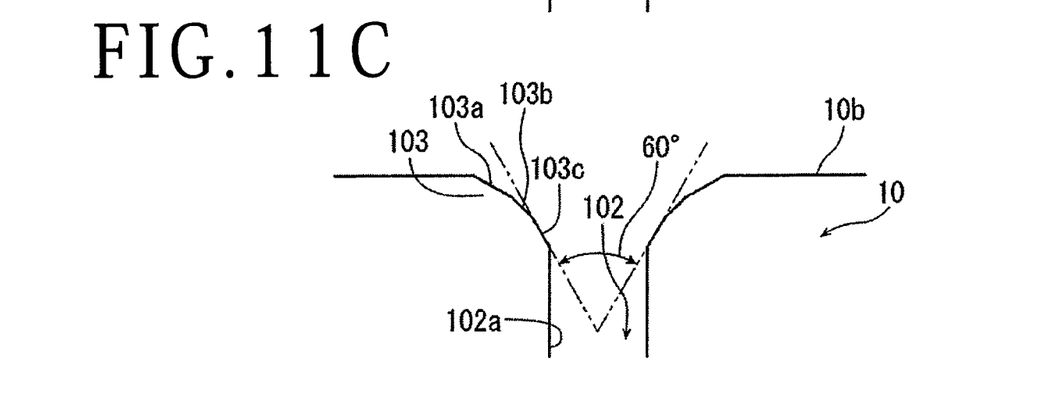
FIG. 11C is a view similar to FIG. 11B, depicting a condition where the LED wafer has been further chamfered by the third V-blade.

After forming the second chamfered portion 103b along each polished groove 102 as mentioned above, the spindle 54 is stopped again and the spindle unit 50 is next raised. In this condition, the second V-blade 64 is removed from the spindle 54, and the third V-blade 65 having the third cutting edge 65a having a tip angle of 60 degrees is next mounted on the spindle 54. After mounting the third V-blade 65 on the spindle 54, the depth of cut by the third V-blade 65 is further increased by 0.05 mm from the depth of cut (=0.1 mm) by the second V-blade 64, that is, the depth of cut by the third V-blade 65 is set to 0.15 mm from the back side 10b of the LED wafer 10. In this condition, the back side 10b of the LED wafer 10 is similarly cut along each polished groove 102 by the third V-blade 65. That is, the upper end of each polished groove 102 previously chamfered by the second V-blade 64 is further chamfered by the third V-blade 65. As a result, a third chamfered portion 103c is formed along each polished groove 102 having the first chamfered portion 103a and the second chamfered portion 103b as depicted in FIG. 11C. As apparent from FIG. 11C, the third chamfered portion 103c is formed below the second chamfered portion 103b (i.e., toward the front side 10a of the LED wafer 10) along each polished groove 102 because the third cutting edge 65a having a tip angle of 60 degrees is used and the depth of cut by the third V-blade 65 is further increased by 0.05 mm as mentioned above.

In this manner, the depth of cut in forming the chamfered portion 103 is stepwise increased to perform a cutting operation in plural stages, i.e., in three stages in this preferred embodiment. Accordingly, the chamfered portion 103 is composed of the first chamfered portion 103a, the second chamfered portion 103b, and the third chamfered portion 103c, which are continuously connected in this order to form a pseudo curved surface. Further, the chamfered portion 103 is formed by using a cutting blade containing diamond abrasive grains having a small grain size similar to that in the polishing step. Accordingly, as similar to the polished surfaces 102a of each polished groove 102, the chamfered portion 103 of each polished groove 102 can contribute to an improvement in luminance of each LED chip 14'. The depth of cut to be stepwise increased in the chamfering step is not limited to 0.05 mm per stage, but it may be suitably adjusted. However, the depth of cut to be stepwise increased in the chamfering step is preferably selected in the range of 0.04 to 0.06 mm per stage. Further, the sizes and angles depicted in the drawings are suitably modified for convenience of illustration and they are not actual sizes and angles. Further, the tip angle of the first cutting edge 63a of the first V-blade 63 is preferably selected in the range of 110 to 130 angles. The tip angle of the second cutting edge 64a of the second V-blade 64 is preferably selected in the range of 80 to 100 degrees. The tip angle of the third cutting edge 65a of the third V-blade 65 is preferably selected in the range of 50 to 70 degrees.

The present invention is not limited to the above preferred embodiments, but various modifications may be made. For example, in the above preferred embodiments, the dividing step is performed by using the first cutting blade 61 having the first cutting edge 61a having a width of 0.2 mm, and the polishing step is performed by using the second cutting blade 62 having the second cutting edge 62a having a width of 0.3 mm. However, the width of the first cutting edge 61a and the width of the second cutting edge 62a may be suitably adjusted according to the width of each division line 12. However, if the difference in width between the first cutting edge 61a and the second cutting edge 62a is too large, the time required for performing the polishing step becomes long. Therefore, it is desirable to set the difference in width between the first cutting edge 61a and the second cutting edge 62a as small as possible. Conversely, if the difference in width between the first cutting edge 61a and the second cutting edge 62a is too small, there is a possibility that polishing of the opposed side surfaces 100a of each full-cut groove 100 may become insufficient. Therefore, the difference in width between the first cutting edge 61a and the second cutting edge 62a is preferably set in the range of 0.05 to 0.15 mm, for example.

In the above preferred embodiments, the dividing step, the polishing step, and the chamfering step are performed by using the same cutting apparatus 40 and changing a cutting blade, that is, using different cutting blades. As a modification, a plurality of cutting apparatuses dedicated to the dividing step, the polishing step, and the chamfering step may be prepared. In this case, after finishing the dividing step, the LED wafer 10 is transferred from the first cutting apparatus dedicated to the dividing step to the second cutting apparatus dedicated to the polishing step. Further, after finishing the polishing step, the LED wafer 10 is transferred from the second cutting apparatus dedicated to the polishing step to the third cutting apparatus dedicated to the chamfering step.

Further, in the second preferred embodiment, the chamfering step is performed to the polished grooves 102 formed along the division lines 12 after performing the dividing step and the polishing step. As a modification, the chamfering step may be performed before performing the dividing step and the polishing step. In this case, the chamfered portion 103 is formed on the back side 10b of the LED wafer 10 in an area corresponding to each division line 12 formed on the front side 10a of the LED wafer 10, before performing the dividing step and the polishing step. After forming the chamfered portion 103 on the back side 10b of the LED wafer 10, the dividing step and the polishing step are performed to the front side 10a of the LED wafer 10 to thereby form the polished groove 102 along each division line 12 so that the polished groove 102 reaches the chamfered portion 103.

In the second preferred embodiment, the chamfering step is performed by using the three kinds of V-blades, that is, the first V-blade 63 having a tip angle of 120 degrees, the second V-blade 64 having a tip angle of 90 degrees, and the third V-blade 65 having a tip angle of 60 degrees. However, this configuration is merely illustrative, and the chamfering step may be performed by using one kind of V-blade having a suitable tip angle. Further, the chamfering step may be performed by using two kinds of V-blades having different tip angles or by using four or more kinds of V-blades having different tip angles. In this manner, in the case of performing the chamfering step by using a plurality of kinds of V-blades having different tip angles, the tip angles may be suitably adjusted according to the number of the plural V-blades. Owing to the use of the plural V-blades having different tip angles in performing the chamfering step, the chamfered portion 103 can be made into a pseudo curved surface, thereby contributing to an improvement in luminance of each LED chip 14'.

The above-mentioned processing conditions including the rotational speed of the spindle 54, the depth of cut to be stepwise increased, and the feed speed in the dividing step, the polishing step, and the chamfering step are merely illustrative and it is needless to say that they may be suitably adjusted.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A light emitting diode wafer processing method for dividing a light emitting diode wafer along a plurality of crossing division lines to obtain a plurality of individual light emitting diode chips, the light emitting diode wafer being formed from a sapphire substrate having a front side, the plurality of crossing division lines being formed on the front side of the sapphire substrate to thereby define a plurality of separate regions where a plurality of light emitting diodes are respectively formed, the light emitting diode chips respectively including the light emitting diodes, the light emitting diode wafer processing method comprising:

a cutting blade preparing step of preparing a first cutting blade having an annular first cutting edge having a first width and a second cutting blade having an annular second cutting edge having a second width larger than the first width, the first cutting edge containing diamond abrasive grains having a first grain size, the second cutting edge containing diamond abrasive grains having a second grain size smaller than the first grain size;

a dividing step of rotatably mounting the first cutting blade in first cutting means, holding the light emitting diode wafer on a holding table in a condition where a front side of the light emitting diode wafer is exposed upward, and then relatively moving the first cutting means and the holding table to cut the front side of the light emitting diode wafer along each division line, thereby forming a full-cut groove along each division line, so that the full-cut groove has a depth reaching a back side of the light emitting diode wafer, whereby the light emitting diode wafer is divided into the individual light emitting diode chips;

a polishing step of rotatably mounting the second cutting blade in second cutting means after performing the dividing step, and then relatively moving the second cutting means and the holding table holding the light emitting diode wafer to thereby polish opposed side surfaces of the full-cut groove formed along each division line, whereby a polished groove larger in width than the full-cut groove is formed along each full-cut groove;

after performing the polishing step, a V-blade preparing step of preparing a V-blade having an annular cutting edge whose outer circumferential portion has a V-shaped cross section; and a chamfering step of rotatably mounting the V-blade in cutting means, holding the light emitting diode wafer on the holding table in a condition where the back side of the light emitting diode wafer is exposed upward, and then relatively moving the cutting means and the holding table to form a chamfered portion on the back side of the light emitting diode wafer in an area corresponding to each division line formed on the front side of the light emitting diode wafer.

2. The light emitting diode wafer processing method according to claim 1, wherein a depth of cut by the first cutting blade in the dividing step is stepwise increased to cut the front side of the light emitting diode wafer along each division line in plural stages.

3. The light emitting diode wafer processing method according to claim 1, wherein the average grain size of the diamond abrasive grains contained in the first cutting edge is set in a range of #300 to #500 as the first grain size, and the average grain size of the diamond abrasive grains contained in the second cutting edge is set in a range of #1800 to #2200 as the second grain size.

4. The light emitting diode wafer processing method according to claim 1, wherein the width of the first cutting edge is set in a range of 0.15 to 0.24 mm as the first width, and the width of the second cutting edge is set in a range of 0.25 to 0.34 mm as the second width.

5. The light emitting diode wafer processing method according to claim 1, wherein the V-blade includes a plurality of V-blades having a plurality of annular cutting edges whose outer circumferential portions have different V-shaped cross sections such that the plurality of annular cutting edges of the plurality of V-blades have different tip angles, and the chamfering step is performed by stepwise mounting the plurality of V-blades in the cutting means.

6. The light emitting diode wafer processing method according to claim 5, wherein the plurality of V-blades include three kinds of V-blades having three kinds of cutting edges, and the different tip angles of the three kinds of cutting edges include a first tip angle of 110 to 130 degrees, a second tip angle of 80 to 100 degrees, and a third tip angle of 50 to 70 degrees.

7. The light emitting diode wafer processing method according to claim 1, wherein the cutting edge of the V-blade contains diamond abrasive grains having an average grain size of #1800 to #2200.

8. The light emitting diode wafer processing method according to claim 5, wherein a depth of cut by the plurality of V-blades is stepwise increased in the chamfering step every time the V-blades are stepwise mounted in the cutting means, thereby cutting the back side of the light emitting diode wafer along each division line in plural stages.

9. The light emitting diode wafer processing method according to claim 8, wherein a depth of cut to be stepwise increased in the chamfering step is set in a range of 0.04 to 0.06 mm per stage.

10. The light emitting diode wafer processing method according to claim 1, wherein the annular cutting edge of the V-blade has an outer diameter that is larger than a width of each groove.

11. The light emitting diode wafer processing method according to claim 10, wherein the outer diameter of the annular cutting edge of the V-blade is 60 mm and the annular cutting edge has a width of 3 mm.

* * * * *